United States Patent [19]

Childers

[11] Patent Number: 4,720,817
[45] Date of Patent: Jan. 19, 1988

[54] FUSE SELECTION OF PREDECODER OUTPUT

[75] Inventor: Jimmie D. Childers, Missouri City, Tex.

[73] Assignee: Texas Instruments Incorporated, Dallas, Tex.

[21] Appl. No.: 706,057

[22] Filed: Feb. 26, 1985

[51] Int. Cl.⁴ .................. G11C 17/00; G11C 7/00; G06F 11/00
[52] U.S. Cl. ........................ 365/200; 365/96; 371/11
[58] Field of Search ............ 365/200, 96, 230; 371/11

[56] References Cited

U.S. PATENT DOCUMENTS

| | | | |
|---|---|---|---|
| 4,051,354 | 9/1977 | Choate | 365/200 |
| 4,598,388 | 7/1986 | Anderson | 365/200 |
| 4,604,727 | 8/1986 | Shah et al. | 365/230 |

Primary Examiner—Terrell W. Fears
Assistant Examiner—Melissa J. Koval
Attorney, Agent, or Firm—John G. Graham

[57] ABSTRACT

A fuse selectable decoder for a redundant row of memory elements in an array includes a redundant decode select circuit (38) for receiving predecoder inputs from predecode lines (28), (30), (32) and (34). The predecode lines are output from predecoders (20), (24) and (26) which decode an eight bit address word. The redundant decode select circuit (38) is programmed by fuse select circuit (40) that selects the address of a defective one of the rows of memory elements in an array (10). The redundant decode select circuit (38) selects one line out of each of the predecode lines (28), (30), (32) and (34) for input to an AND gate (112) for selecting the redundant row (12).

18 Claims, 6 Drawing Figures

FUSE SELECTION OF PREDECODER OUTPUT

TECHNICAL FIELD OF THE INVENTION

The present invention relates in general to semiconductor memory devices and, more particularly, to the row and column decoders utilized therewith.

BACKGROUND OF THE INVENTION

In fabrication of semiconductor memories, one technique utilized to increase production yield is to provide redundant circuits on the chip to allow for placement of key circuits which prove defective. During testing of the chip, the defective portion of the circuit is identified and the redundant circuit, if one exists, is activated by opening an associated fuse or similar mechanism. The disadvantage to this technique is that only certain circuits on the chip can be given redundancy, which is sometimes impractical from a cost versus yield standpoint.

Redundancy is especially suited for repetitive circuits having a large number of repeating elements arranged in some form of an array, such that one redundant circuit can replace a single defect in any of a large number of circuit elements. One such device is a semiconductor memory array comprised primarily of memory elements arranged in rows and columns with each row of memory elements activated by a single control line or, more commonly, a bit line. The redundant element in the memory array would either be a row of memory elements or a column of memory elements. If, for example, one element in a given row was determined to be defective, this would classify the device as defective. This defective column could then be replaced by a redundant column and the device would be fully operational. This is normally accomplished by deactivating the defective row and addressing the redundant row with the address of the defective row.

To address the redundant row with the address of the defective row requires interconnecting the output of the row decoder associated with the defective column with the bit line of the redundant row or providing a separate programmable decoder for the redundant row. To provide separate interconnects between each of the outputs of the row decoder with the bit line of the redundant row would require a large number of fuse selected interconnects. For example, in a 256 row memory, the row decoder provides 256 decoder outputs for connection to the individual bit lines of the various rows. Therefore, a redundant row would require 256 fuse selectable interconnects, which would require a large number of metal runs on the surface of the silicon chip. The alternate method is to utilize a programmable decoder which is dedicated to the redundant row. A decoder of this type would also require a large amount of circuitry and associated silicon surface area in the memory array.

In view of the above disadvantages with selecting the address for a redundant row in a memory array, there exists a need for a fuse selectable decoder which minimizes the amount of additional circuitry and silicon surface area required to select the redundant row.

SUMMARY OF THE INVENTION

The present invention disclosed and claimed herein comprises a defect tolerant memory which has a redundant row of memory elements disposed adjacent an array of memory elements. The row address is input to predecoders which output a plurality of mutually exclusive predecoded signals. These predecoded signals are input to a decoder for providing a mutually exclusive output for each of the rows in the array. In addition, a redundant decoder is provided which receives the predecoded signals on the input thereof and outputs a single mutually exclusive output for controlling the redundant row of elements. The redundant decoder is programmable to select one of the predecoded lines from each of the predecoders, such that the mutually exclusive output can be programmed for any row address.

In another embodiment of the present invention, each of the rows can be selectively deactivated if an internal defect is determined. After deactivation, the redundant decoder is programmed to activate the redundant row in response to receiving the address of the defective row which was deactivated. In this manner, the defective row is defectively replaced.

In yet another embodiment of the present invention, the redundant decoder is comprised of a plurality of select circuits, each select circuit associated with one of the predecoders. Each of the select circuits is fuse programmable to select one of the predecode lines output from the associated one of the predecoders. The output of each of the select circuits is connected to the input of a multiple input NAND gate, the output of which is connected to the control input of the redundant row.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
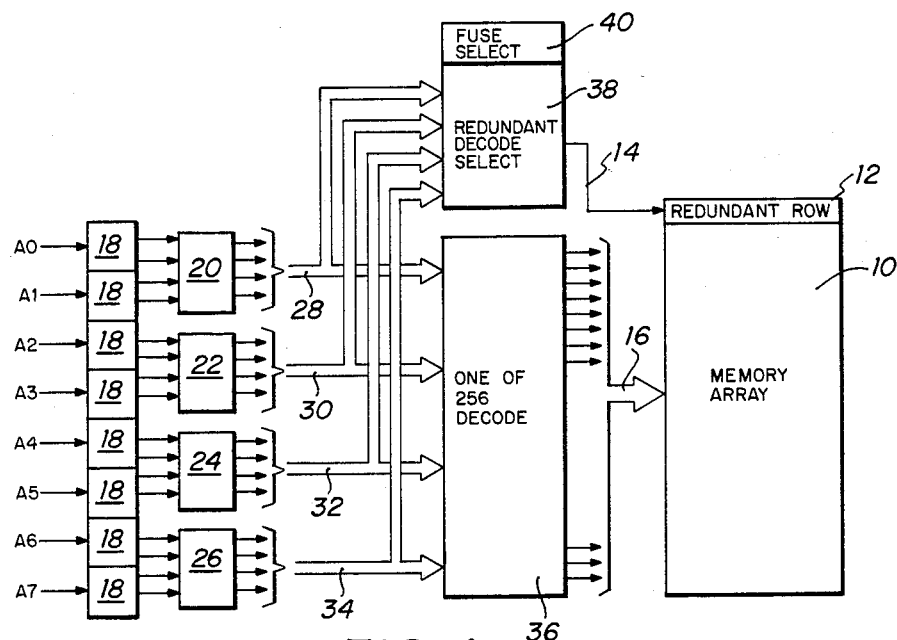
FIG. 1 illustrates a schematic block diagram of the redundant decoder of the present invention in association with a conventional memory cell array.

Referring now to FIG. 1, there is illustrated a schematic block diagram of a row decoder for selecting a row on a memory array 10. The memory array 10 is comprised of an array of memory elements that are arranged in rows and columns. A typical example of a memory array would be one wherein the memory cells are arranged in 256 rows of 128 columns to provide 32k or 32,768 bits. Memory arrays of this type are illustrated in U.S. Pat. No. 4,081,701, issued to L. S. White, et al. on Mar. 28, 1978 and U.S. Pat. No. 4,239,993, issued to McAlaxander, III, et al. on Dec. 16, 1980, both of which are assigned to Texas Instruments Incorporated.

A redundant row of memory elements 12 is disposed adjacent the memory array 10 such that the individual memory elements of the redundant row 12 correspond to columns in the memory array 10. The redundant row 12 has a bit line 14 connected thereto for selecting the memory elements therein. Selection of one or more of the memory elements in the redundant row 12 requires selection of corresponding columns and activation of the bit line 14. In a similar manner, selection of any of the rows of memory elements in the array 10 requires activation of a corresponding bit line, the bit lines of the rows of memory elements in the array 10 being represented by bit lines 16.

An eight bit address A0-A7 is input to the semiconductor memory and stored in a latch (not shown). Each of the address bits A0-A7 output from the row address latch are input to buffers 18 to supply the inverted and noninverted forms thereof. Therefore, the buffers 18 associated with the A0 address bit would output A0 and $\overline{A0}$. The inverted and noninverted forms of the latched address bits are input to predecoders 20, 22, 24 and 26. The predecoder 20 is associated with the address bits A0 and A1, the predecoder 22 is associated with the address bits A2 and A3, the predecoder 24 is associated with address bits A4 and A5 and the predecoder 26 is associated with address bits A6 and A7. The buffers 18 and the predecoders 20-26 associated with each pair of adjacent latched address bits provide a two-to-four decoding operation. Therefore, each of the decoders 20-26 outputs four outputs, each output indicating one logic state of the associated pair of address bits. The buffers 18 and the predecoders 20-26 are similar in operation to the decoder circuit illustrated in U.S. Pat. No. 4,314,362, issued to Klass, et al. on Feb. 2, 1982, and assigned to Texas Instruments Incorporated.

The output of the predecoder 20 is comprised of four lines, represented by a predecode line group 28. In a similar manner, a group of four predecode lines 30 is associated with the predecoder 22, a group of four predecode lines 32 is associated with the predecoder 24 and a group of four predecode lines 34 is associated with the predecoder 26. The predecode lines 28-34, which represent the outputs of the predecoders 20-26, are all input to a one-of-256 decoder 36 to output 256 mutually exclusive decode outputs which are connected to the bit line 16. Only one of the 256 output bit lines 16 is activated at any one time to allow selection of an individual row of the memory cells in the array 10.

The predecode lines 28-34 are also input to a redundant decode circuit 38, which has the output thereof connected to the bit line 14 to activate the redundant row of memory elements 12. The redundant decode circuit 38 is programmable by a fuse select circuit 40, which is comprised of a group of fuses that can be selectively opened during the fabrication and testing process. In operation, the determination of a defective one of the rows of memory elements in the array 10 requires deactivation of the bit line associated therewith and programming of the redundant decode circuit 38. The redundant decode circuit 38 is programmed by selecting one of the four lines in each of the predecode line groups 28-34. Since each of the groups of predecode lines 28-34 is comprised of four individual lines, it is only necessary to select one line out of each of the groups and "AND" these four lines together to provide the decoding operation. The redundant decode circuit 38 in conjunction with the fuse select circuit 40 provides this capability, as will be described hereinbelow.

Figure 2:
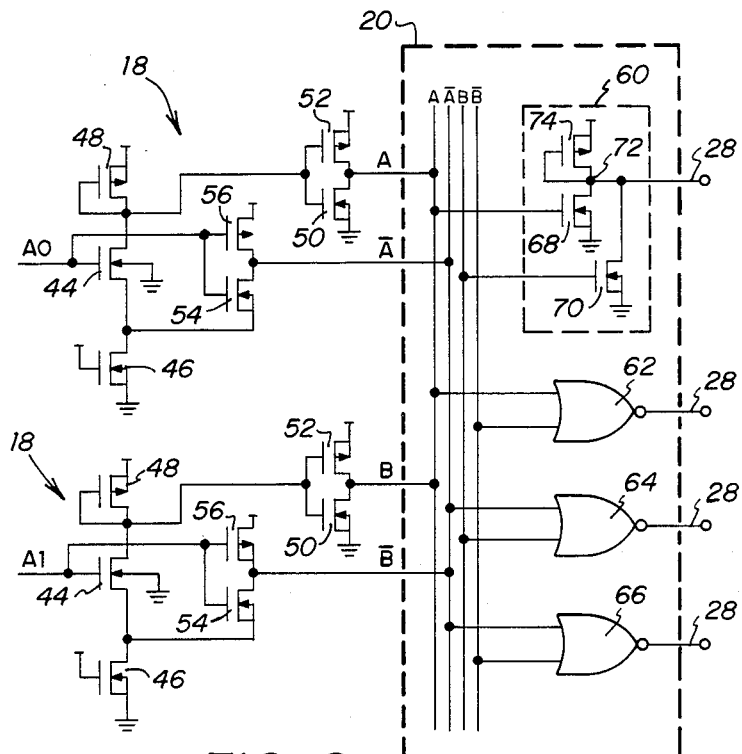
FIG. 2 illustrates a schematic diagram of the buffer and predecoders.

Referring now to FIG. 2, there is illustrated a schematic block diagram of the predecoder 20 and the associated buffer 18. The address bit for each of the buffers 18 is input to an n-channel transistor 44 which has the source thereof connected to ground through an n-channel transistor 46 and to $V_{DD}$ through a p-channel transistor 48, which has the gate thereof shorted to the source. The drain of the transistor 44 is connected to the gates of n-channel transistor 50 and p-channel transistor 52. The source of the transistor 50 is connected to ground and the drain thereof connected to the source of the transistor 52. The transistor 52 has the drain thereof connected to $V_{DD}$. The drain of the transistor 50 comprises the noninverted output "A" which is input to the predecoder 20.

The address A0 is also input to the gate of an n-channel transistor 54, which has the source thereof connected to ground through the transistor 46 and the drain thereof connected to the source of the p-channel of transistor 56. Transistor 56 has the gate thereof connected to the gate of transistor 54 and the drain thereof connected to $V_{DD}$. The drain of the transistor 54 comprises the inverted form of the bit line and is labeled "$\overline{A}$" for the buffer associated with the A0 bit line. The buffer 18 associated with the address bit A1 has the noninverted form labeled "B" and the inverted form labeled "$\overline{B}$".

In operation, a high logic state on the gate of transistor 44 sources current from $V_{DD}$ to a transistor 48 to ground through transistor 46 to lower the voltage on the gates of transistors 50 and 52. This results in a logic high state on the noninverted output. A logic high on the gates of transistors 54 and 56 results in a logic low on the inverted output.

The buffer 18 is comprised of four NOR gates, 60, 62, 64 and 66. The two inputs of the NOR gate 60 are connected to the "A" output and the "B" output, respectively. The two inputs of the NOR gate 62 are connected to the "A" output and the "$\overline{B}$" output, respectively. The two inputs of the NOR gate 64 are connected to the "$\overline{A}$" and the "B" outputs, respectively. The two inputs of the NOR gate 68 are connected to the "$\overline{A}$" and the "$\overline{B}$" outputs, respectively. The four predecode lines 28 therefore constitute one of four logic states or combinations for the two address bits A0 or A1 with only one of the lines 28 being at a logic high for any combination.

Each of the NOR gates 60-66 is comprised of two n-channel transistors 68 and 70 having the drains thereof connected to a node 72 and the sources thereof connected to ground. The gates constitute the two inputs of the NOR gates 60-66. A p-channel load transistor 74 is connected between $V_{DD}$ and the node 72 with the source and gate shorted. The node 72 constitutes the output of each of the NOR gates 60-66.

Figure 3:
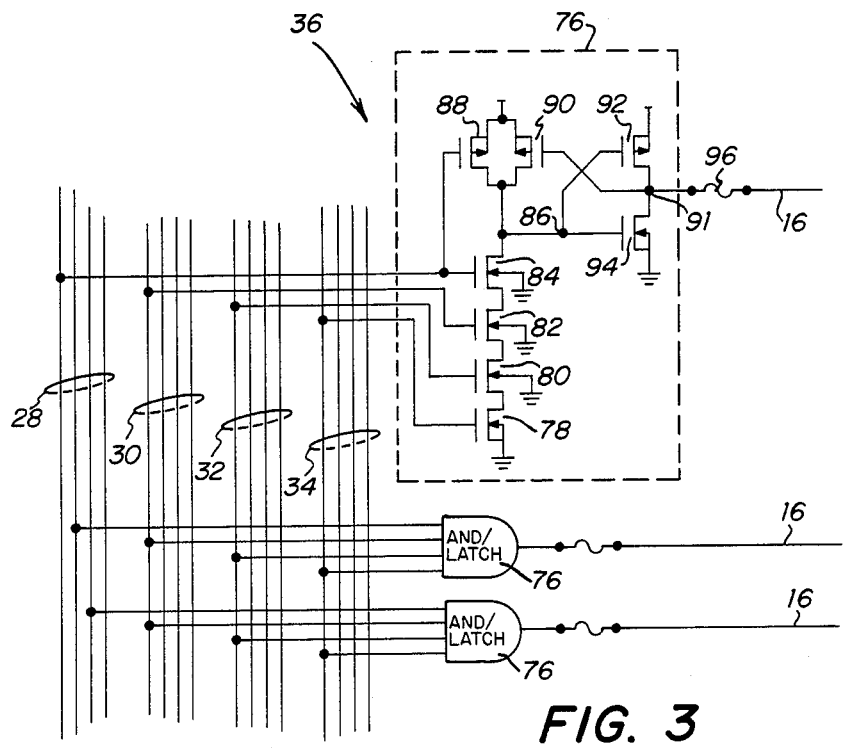
FIG. 3 illustrates a schematic diagram of the one-of-256 decoder.

Referring now to FIG. 3, there is illustrated a schematic diagram of the one-of-256 decoder 36, wherein like numerals refer to like parts in the various Figures. The decoder 36 is comprised of 256 four input NAND gates 76 which have one input each connected to a select one of the four lines in the predecode lines 28-34. For example, to code for the least significant address, the four inputs of the associated one of the NAND gates 76 will be connected to the least significant line in each of the predecode lines 28-34. For the next successive address, the associated NAND gate 76 would be connected to the least significant line in each of the predecode lines 30, 32 and 34 but to the next successive line in the predecode lines 28. To decode the most significant address, the inputs of the NAND gates 76 associated with the most significant row are connected to the most significant lines in each of the predecode lines 28-34.

Each of the NAND gates 76 is comprised of four series connected n-channel transistors 78, 80, 82 and 84.

The transistors 78-84 are connected between a node 86 and ground with the gate of transistor 78 associated with the predecode lines 34, the gate of the transistor 80 associated with the predecode lines 32, the gate of the transistor 82 associated with the predecode lines 30 and the gate of the transistor 84 associated with the predecode lines 28. A p-channel transistor 88 is connected between $V_{DD}$ and the node 86, with the gate connected to the gate of transistor 84. A p-channel transistor 90 is also connected between $V_{DD}$ and the node 86 with the gate thereof connected to a node 91. A p-channel transistor 92 is connected between $V_{DD}$ and the node 91 and an n-channel transistor 94 is connected between the node 91 and ground. The gates of transistor 92 and 94 are connected to the node 86.

In operation, the node 86 is pulled to ground when all four inputs to the AND gate 76 are high. Transistor 88 is turned off and p-channel transistor 92 turned on to raise node 96 high. This turns off transistor 90. When any of the transistors 78-82 are turned off, node 86 is kept from floating by "keeper" transistor 90 unless the gate of transistor 84 is low which resets the latching effect caused by the cross-coupled transistors 90-92. This will turn transistor 88 on and pull node 86 high. This turns on transistor 94 and turns off transistor 92, pulling node 91 to ground. This turns on transistor 90.

Each of the NAND gates 76 has the node 91 connected to a redundant bit line through a fuse 96. The fuse 96 allows for deactivation of one or more of the decode outputs.

Figure 4:
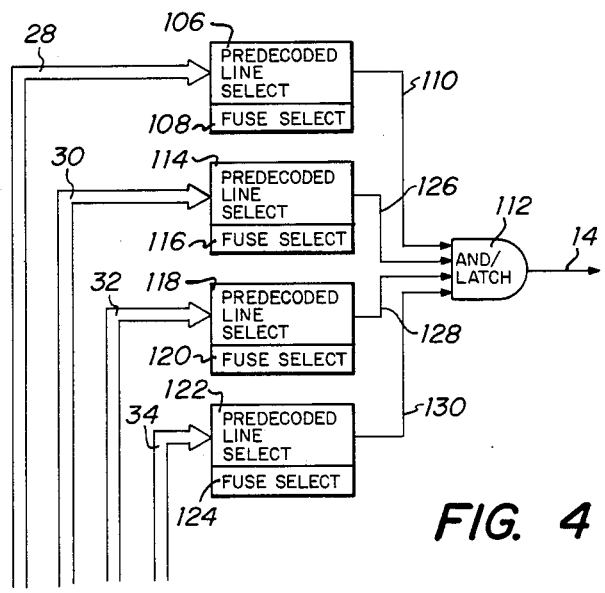
FIG. 4 illustrates a schematic block diagram of the fuse selectable redundant decoder.

Referring now to FIG. 4, there is illustrated a schematic block diagram of the redundant decode circuit 38 and the fuse select circuit 40, wherein like numerals refer to like parts in the various Figures. The four lines 28 are input to a predecode line select circuit 106 which is controlled by a fuse select circuit 108. The fuse select circuit 108 is operable to control the predecode line select circuit 106 to select one of the four lines 28. The output of the predecode select circuit 106 is represented by an output line 110 which is input to one input of a four input AND gate 112. AND gate 112 is similar to the AND gates 76 in the one-of-256 decoder 36. In a similar manner, the four predecode lines 30 are input to a predecode line select circuit 114 and an associated fuse select circuit 116. The four predecode lines are input to a predecode line select circuit 118 with an associated fuse select circuit 120. The four predecode lines 34 are input to a predecode line select circuit 122 which has a fuse select circuit 124 associated therewith. The output of the predecode line select circuits 114, 118 and 122 are input to the remaining three inputs of the four input AND gate 112 through lines 126, 128 and 130, respectively. The output of the AND gate 112 corresponds to the bit line 14 that is input to the redundant row 12.

In operation, the address of the redundant row 12 is selected by selecting one of the predecode lines from each of the four predecode line groups 28, 30, 32 and 34. This selection is made by opening a single fuse, as will be described hereinbelow, that selects one of the lines and outputs it to the one of the four inputs of the AND gate 112. Since there are a total of sixteen predecode lines for an eight to 256 row decoder, only a maximum of sixteen fuses would be required in order to program the redundant decode circuit 38. An additional fuse would be required to deactivate the defective row, as will be described hereinbelow.

Figure 5:
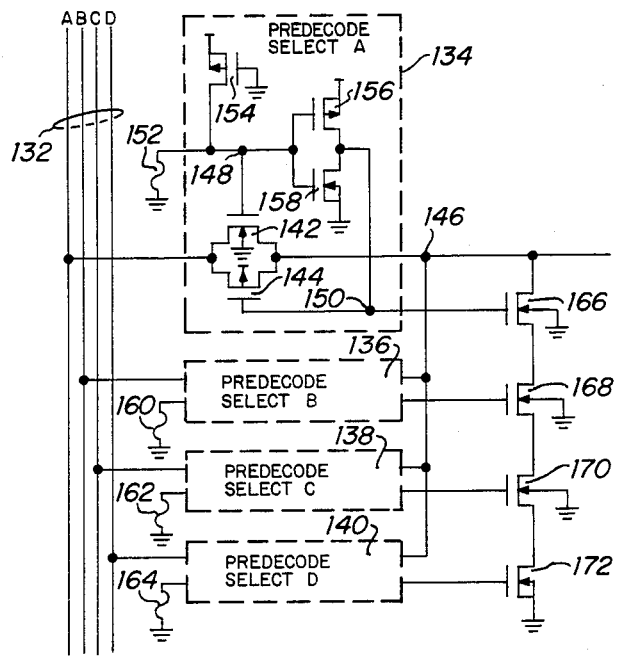
FIG. 5 illustrates a schematic diagram of one cell of the redundant decoder.

Referring now to FIG. 5, there is illustrated a schematic diagram of one of the predecode line select circuits 106, 114, 118 and 122 with the associated fuse select circuits 108, 116, 120 and 124, respectively. The predecode lines 28-34 are represented by four parallel lines 132 labeled "A", "B", "C" and "D" with line "A" being the least significant line. Of the lines 132, line "A" is input to a Predecode Select A circuit 134, line "B" is input to a Predecode Select B circuit 136, line "C" is input to a Predecode Select C circuit 138 and line "D" is input to a Predecode Select D circuit 140. Of the Predecode Select circuits 134-140, only the Predecode Select A circuit 134 is illustrated in detail.

Line A of the lines 132 is input to the drains of an n-channel transistor 142 and a p-channel transistor 144, the sources of transistors 142 and 144 are connected to a node 146. The gate of the transistor 142 is connected to a node 148 and the gate of the transistor 144 is connected to a node 150. The node 148 is connected to ground through a fuse 152 that is external to the Predecode Select A circuit 134. The node 148 is also connected to $V_{DD}$ through a p-channel transistor 154, the gate of which is connected to ground. The transistor 154 is a p-channel load transistor. The node 148 also drives the gates of a p-channel transistor 156 and an n-channel transistor 158. The transistor 158 has the source thereof connected to ground and the drain thereof connected to the node 150 and the transistor 156 has the drain thereof connected to $V_{DD}$ and the source thereof connected to the node 150.

When the fuse 152 is intact, the node 148 is held at ground potential, thus turning transistor 142 off and transistor 158 off, and transistor 156 is turned on, thus raising the node 150 to $V_{DD}$. This turns transistor 144 off. Therefore, with the fuse 152 in place, transistors 142 and 144 are at a high impedance state to prevent the voltage on line A from the input to node 146, which is the output of the predecoder select that is input to one input of the four input AND gate 112.

When the fuse 152 is open, the transistor 154 raises the voltage on the node 148, turning on transistors 142 and 158 and transistor 156 turns off. Node 150 is lowered to ground potential, turning on transistor 144. With transistors 142 and 144 turned on, a low impedance is presented between node 146 and line A. The use of both the p-channel transistor 144 and the n-channel transistor 142 in a parallel combination allows the voltage drop thereacross to be approximately zero volts. If only the n-channel transistor 142 were utilized, there would be a voltage drop equal to the threshold voltage of that transistor. Each of the Predecode Select B, Predecode Select C and Predecode Select D circuits 136-140 has an output connected to the node 146 to connect the respective line B, line C and line D to the node 146. The Predecode Select B circuit 136 is selected by opening a fuse 160, the Predecode Select C circuit 138 is activated by opening a fuse 162 and the Predecode Select D circuit 140 is operated by opening a fuse 164. Only one of the fuses 152, 160, 162 or 164 is selected since only one of the predecode lines 132 is to be connected to the node 146 for a given decoding operation.

To properly terminate the node 146, four series connected n-channel transistors 166, 168, 170 and 172 are connected between the node 146 and ground. The gate of the transistor 166 is connected to the node 150 of the Predecode Select A circuit 134, and similar outputs from the Predecode Select B circuit 136, the Predecode Select C circuit 138 and the Predecode Select D circuit 140 are connected to the gates of transistors 168, 170 and 172, respectively. When the fuses 152, 160, 162 and 164 are intact, the gates of the transistors 166–172 are at a high potential, thus turning all four transistors on and connecting node 146 to ground. Conversely, when one of the fuses 152, 160, 162 or 164 are opened, one of the transistors 166–172 has its gate connected to ground, thus turning off the respective one of the transistors 166–172. This effectively allows node 146 to seek the potential of the lines 132 to which it is connected. If the terminating potential on the node 146 were to be at a high voltage level, p-channel transistors (not shown) would be utilized between $V_{DD}$ and the node 146 to replace the n-channel transistors 166–172. The gates of the p-channel transistors would be driven from the node 148 to lower the gate to a low potential when the fuses 152, 160, 162 and 164 were intact and to a high potential when they are opened.

Figure 6:
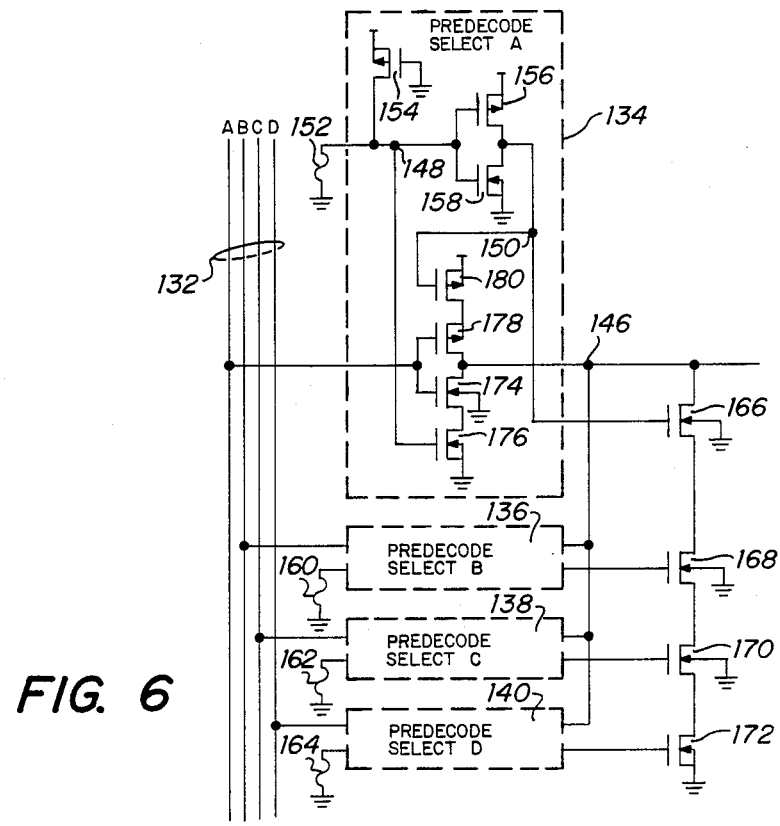
FIG. 6 illustrates an alternate embodiment of the fuse selectable redundant decoder.

Referring now to FIG. 6, there is illustrated an alternate embodiment of the Predecode Select circuit A 134, Predecode Select Circuit B 136, Predecode Select Circuit C 138 and Predecode Select Circuit D 140, wherein like numerals refer to like parts in the various Figures. The transistors 142 and 144 are replaced by two n-channel transistors 174 and 176 and two p-channel transistors 178 and 180. The gates of transistors 174 and 178 are connected to line A of the Predecode Lines 132 and the drain of transistor 178 and the drain of transistor 174 are connected to the node 146. The source of transistor 174 is connected to ground through the transistor 176, the gate of which is connected to the node 148. In a similar manner, the source of transistor 178 is connected to $V_{DD}$ through transistor 180, the gate of which is connected to the node 150. The node 150, as described above, drives the gate of the transistor 166.

In operation, the node 148 with the fuse 152 intact is at a low voltage level, turning transistor 176 and transistor 158 off and transistor 156 on. This holds node 150 at a high potential, turning transistor 180 off. When transistors 176 and 180 turn off, no current can flow through transistors 174 or 178. Therefore, no current will be sourced to or sinked from node 146. Conversely, when the fuse 152 is opened, node 148 is high turning on transistor 176 and node 150 is low turning on transistor 180. This then allows transistor 174 and transistor 178 to conduct, and source current to or sink current from node 146.

In summary, there has been provided a memory array with one column of redundant memory cells which are activated by a redundant row decoder. The redundant row decoder is activated by opening four of sixteen fuses that are fabricated on the semiconductor chip. These four fuses select four predecode lines, one each from four predecoders. These selected lines are then decoded. By opening these four fuses, one address from an eight bit address can be programmed into the redundant column decoder such that addressing of the defective column allows activation of the redundant row. The defective column is removed by opening a series fuse between the decoder output and the bit line of the defective row of memory elements.

Although the preferred embodiment has been described in detail, it should be understood that various changes, substitutions and alterations can be made therein without departing from the spirit and scope of the invention as defined by the appended claims.

What is claimed is:

1. A defect tolerant memory device, comprising:
   an array of memory elements arranged in rows and columns, each of said rows having a control input for activation thereof, said rows addressable by an external address having n bits received at terminals of said device, said array having $2^n$ rows;
   a row of redundant memory elements disposed adjacent said array and having a redundant control input for activation thereof;
   a plurality of predecode means each for receiving m adjacent bits of the n bits of said address from said terminals and predecoding the m bits from a binary format into one of $2^m$ mutually exclusive output;
   final decode means for receiving the $2^m$ outputs from each of said predecode means and outputting $2^n$ mutually exclusive decode outputs, each of said $2^n$ decode outputs interfaced with said control input of one of the rows in said array;
   deactivation means for selectively deactivating one of said $2^n$ decode outputs from said final decode means; and
   redundant decode means for receiving the $2^m$ outputs from each of said predecode means and being selectively programmable to activate the redundant control input to said redundant row of memory elements when said address from said terminals corresponding to the deactivated one of the rows in said array is input to said predecode means.

2. The defect tolerant memory of claim 1 wherein n is an even number.

3. The defect tolerant memory of claim 1 wherein m is equal to two.

4. The defect tolerant memory of claim 1 wherein said deactivation means comprises a series fuse connected between each of said $2^n$ decode outputs from said final decode means and the corresponding one of the rows in said array.

5. The defect tolerant memory of claim 1 wherein each of the said decode means comprises one of $2^m$ decoders for receiving m bits in a binary format and outputting $2^m$ mutually exclusive decode outputs.

6. The defect tolerant memory of claim 1 wherein said final decode means comprises logic circuit means associated with each of the control inputs on the rows in said array and having a plurality of input lines, each of said input lines associated with each of said predecode means and one of the $2^m$ output lines therefrom, said logic circuit means outputting a signal when the signals applied to said plurality of inputs is at a predetermined state.

7. The defect tolerant memory of claim 6 wherein said logic circuit means comprises a multiple input NAND gate.

8. The defect tolerant memory of claim 1 wherein said redundant decode means comprises:
   select means associated with the $2^m$ outputs of each of said predecode means, each of said select means selecting one of the $2^m$ output lines associated therewith; and
   logic circuit means having a plurality of inputs, each of said inputs connected to the output of each of said select means, said logic circuit means outputting a signal to the redundant control input of said redundant row when the state of the selected $2^m$ output lines of each of said predecode means is in a predetermined logic state.

9. The defect tolerant memory of claim 8 wherein each of said select means comprises:
   pass gate means connected to each of the associated $2^m$ output lines from the associated one of said predecode means, the outputs of each of said pass gate means in each of said select means connected to a common node for input to one of the plurality of said logic circuit means, each of said pass gate means in the normally open state such that the associated $2^m$ lines are not interconnected to said common node; and programming means for controlling said pass gate means to selectively activate only one of said pass gate means to selectively interconnect one of the associated $2^m$ output lines to said common node.

10. The defect tolerant memory of claim 9 wherein said programming means comprises:

control circuit means associated with each of said pass gate means for controlling said pass gate means to either interconnect the associated one of the $2^m$ outputs to said common node or inhibit interconnection therewith; and a programming fuse interfaced with said control circuit means for each of said pass gate means in each of said select means, opening of said fuse activating said pass means to interconnect the associated one of the $2^m$ outputs to said common node.

11. The defect tolerant memory of claim 8 and further comprising terminating means for terminating said common node to a predetermined logic state when said pass gate means associated with said common node are in the normally opened state, activation of any of said pass gate means deactivating said terminating means.

12. A defect tolerant memory device, comprising:

an array of memory elements arranged in rows and columns, each of said rows having a control input for activation thereof, said rows addressed by an external row address applied to terminals of said device having n bits, said array having $2^n$ rows;

a row of memory elements disposed adjacent said array and having a redundant control input for activation thereof;

a plurality of predecoders each for receiving m adjacent bits of the n address bits from said terminals and predecoding the m bits from a binary format into one of $2^m$ mutually exclusive outputs;

final decode means associated with each of the control inputs for activation thereof, each of said final decode means for receiving a select one of the $2^m$ outputs from each of said predecoders and outputting a decode signal to activate the associated one of said rows, said decode signal occurring when the logic state of the select ones of the $2^m$ outputs are equal to a predetermined logic state;

deactivation means associated with each of said final decode means for inhibiting output of said decode signal, said deactivation means selected to deactivate a defective one of said rows;

select means associated with each of said predecoders for selecting one of the $2^n$ outputs associated therewith, said select means in a normally unselected state;

programming means for determining which of said associated $2^m$ predecode outputs is selected by each of said select means; and redundant decode means associated with said redundant row control input for receiving the outputs of said select means and outputting a redundant decode signal when the logic state of the outputs of each of said select means is equal to a predetermined logic state.

13. The defect tolerant memory of claim 12 wherein said deactivation means comprises a series fuse disposed between each of said final decode means and the control input of the associated one of said rows, opening of said fuse preventing activation of the associated one of said rows.

14. The defect tolerant memory of claim 12 wherein each of said select means comprises a pass gate associated with each of the $2^m$ predecode outputs that are input to said select means and connected between the associated one of said $2^m$ predecode outputs and a common node, said programming means operable to switch one of said pass gates in each of said select means from a nonconducting to a conducting state to place the signal on the associated one of said $2^m$ predecode outputs onto the said common node, said common node connected to said redundant control input.

15. The defect tolerant memory of claim 14 and further comprising means for holding said common node on each of said select means to a predetermined potential when all of said pass gates are in the nonconducting mode, said programming means controlling said inhibiting means to remove said predetermined potential from said common nodes in each of said select means when one of said pass gates in each of said select means is selected.

16. The defect tolerant memory of claim 14 wherein said programming means comprises:

a control circuit for controlling said pass gates; and a fuse interfaced with said control circuit, said control circuit forcing said pass gate to the nonconducting mode when said fuse is intact and forcing the associated one of said pass gates to the conducting mode when said fuse is open.

17. The defect tolerant memory of claim 12 wherein said redundant code means comprises an AND gate having a plurality of inputs, each input associated with each of said predecoders and the $2^m$ outputs therefrom.

18. The defect tolerant memory of claim 12 wherein said final decode means each comprise an AND gate having a plurality of inputs, each of said inputs associated with one of the $2^m$ outputs of each of said predecoders.

* * * * *